United States Patent [19]

Hamajima

US005773352A

[11] Patent Number: 5,773,352
[45] Date of Patent: Jun. 30, 1998

[54] FABRICATION PROCESS OF BONDED TOTAL DIELECTRIC ISOLATION SUBSTRATE

[75] Inventor: Tomohiro Hamajima, Tokyo, Japan

[73] Assignee: NEC Corporation, Tokyo, Japan

[21] Appl. No.: 408,959

[22] Filed: Mar. 23, 1995

[30]         Foreign Application Priority Data

Mar. 24, 1994   [JP]   Japan .................................... 6-053435

[51] Int. Cl.⁶ .................................................. H01L 21/76
[52] U.S. Cl. ........................................... 438/406; 438/459
[58] Field of Search .............................. 437/62, 228 BO; 156/629.1, 630.1; 148/DIG. 12, DIG. 85, DIG. 86; 438/406, 459, 222, 107

[56]                  References Cited

U.S. PATENT DOCUMENTS

| 3,689,357 | 9/1972 | Jordan . |
| 5,308,776 | 5/1994 | Gotou . |
| 5,420,064 | 5/1995 | Okonogi et al. . |

FOREIGN PATENT DOCUMENTS

| 2126625 | 5/1990 | Japan ............................ 148/DIG. 12 |
| 3132055 | 6/1991 | Japan . |
| 3-252154 | 11/1991 | Japan . |
| 3-265153 | 11/1991 | Japan . |
| 5217826 | 8/1993 | Japan . |

OTHER PUBLICATIONS

Easter W., G., et al, "Polysilcon to Silicon Bonding in Dieletrically Isolated Wafers", Extended Abstracts vol. 91–2 The Electrochemical Society Oct. 1991 pp. 707–708.
Horiuchi, M, et al, "A Mechanism of Silicon Wafer Bonding", Extended Abstracts vol. 91–2 The Electrochemical Society Oct. 1991, pp. 667–668.
Mitani, K, "Wafer Bonding Technology . . . A Review", pp. 669–675, 1992 Proceedings of the 1st Int'l Symposium on Semic. Wafer Bonding.

Primary Examiner—George R. Fourson
Attorney, Agent, or Firm—Whitham, Curtis, Whitham & McGinn

[57]                  ABSTRACT

After forming a groove on one surface of a single-crystalline silicon layer, a silicon oxide layer is formed. Also, a polycrystalline silicon layer is formed on the silicon oxide layer to cover the groove. Subsequently, by a buffer layer of polycrystalline silicon is deposited over the polycrystalline silicon layer to form a smooth surface. Thereafter, a silicon oxide layer is formed on a separately prepared supporting substrate. After laminating both substrates by mating the buffer layer and the silicon oxide layer, annealing is performed. By this, voids which might otherwise be generated at the junction interface in the dielectric isolation substrate can be eliminated.

11 Claims, 3 Drawing Sheets

FIG. IA
PRIOR ART
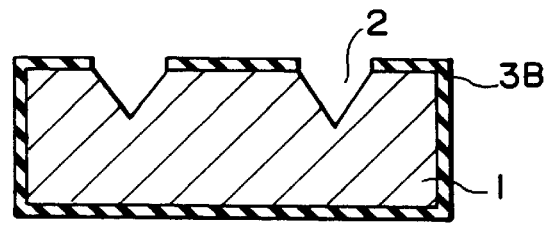
FIG. IB
PRIOR ART
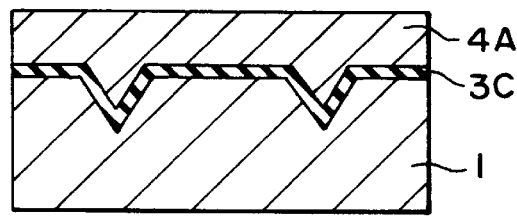
FIG. IC
PRIOR ART
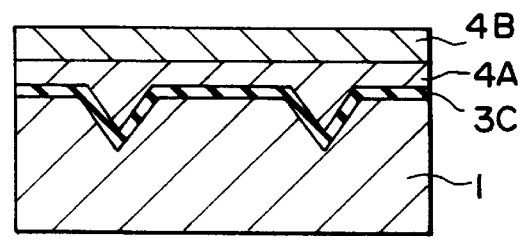
FIG. ID
PRIOR ART
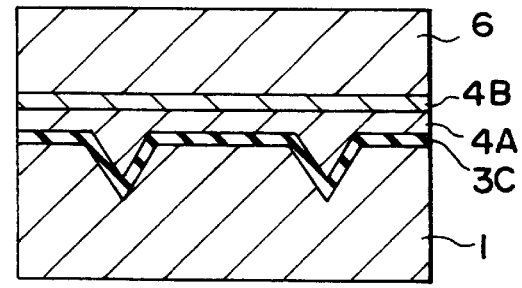
FIG. IE
PRIOR ART
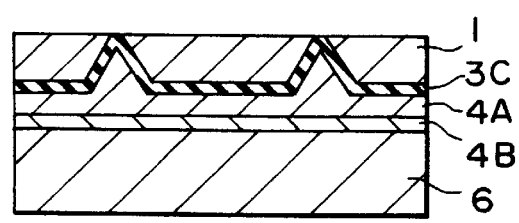

FABRICATION PROCESS OF BONDED TOTAL DIELECTRIC ISOLATION SUBSTRATE

BACKGROUND OF THE INVENTION

1. Field of the Invention

The present invention relates generally to a fabrication process of a dielectric isolation substrate suitable for a semiconductor device for power.

2. Description of the Related Art

As a substrate for a semiconductor device having high isolation voltage between the elements, dielectric isolation substrate has been employed. This is for completely isolating between element regions formed in a single-crystalline silicon layer by a dielectric layer, such as a silicon oxide layer. A plurality of element regions isolated by the dielectric layer are supported by a polycrystalline silicon layer. The dielectric isolation substrate of the construction set forth above encounters the drawback of possible bending of the substrate or defects in the crystal, since the polycrystalline silicon layer has to be deposited in a thick layer and has different thermal expansion coefficients than the single-crystalline silicon layer.

Therefore, there has been proposed a method for mitigating such drawbacks by reducing the thickness of the polycrystalline silicon layer. The substrate produced by this method is obtained by mating a major surface of a single-crystalline silicon substrate to be employed as a supporting substrate and a major surface of a polycrystalline silicon layer forming a composite layer formed with a single-crystalline silicon layer isolated in the form of islands to be element regions and the polycrystalline silicon layer. Hereinafter, this substrate with be referred to as the "substrate of laminated structure". At this time, two junctions in the dielectric isolation substrate are a combination of polycrystalline silicon and single-crystalline silicon.

However, in such dielectric isolation substrate having the laminated structure there is a tendency for gaps or voids to be formed at the interface to make it difficult to obtain complete junction ability through the entire interface. When a void is present at the interface, it becomes possible to cause particle contamination due to exposure of the void, formation of defect due to presence of the void, peeling off of the polycrystalline silicon from the supporting substrate.

For obtaining complete junction, smoothness of the interface for junction becomes important. In particular, it becomes necessary to polish the interface of the polycrystalline silicon layer quite smoothly. However, it is quite difficult to form a smooth surface by polishing the polycrystalline silicon layer. As a solution for this, the major surface of the polycrystalline silicon is roughly polished in the initial process. Then, an amorphous silicon layer or a second polycrystalline silicon layer having smaller crystal size than the polished polycrystalline silicon layer is deposited. Subsequently, the surface of the deposited second polycrystalline silicon layer is polished to obtain the junction surface. Such method has been disclosed in Japanese Unexamined Patent Publication (Kokai) No. Heisei 3-265153.

FIGS. 1A to 1E are show process steps in order of a dielectric isolation substrate fabrication process in the first prior art disclosed in the above-identified publication.

At first, as shown in FIG. 1A, a single-crystalline silicon substrate 1 is prepared, initially. Then, the major surface is subject to oxidation process to form a silicon oxide layer 3b covering the substrate 1. Next, after forming an opening in the predetermined position in the silicon oxide layer 3b, anisotropic etching is performed while using the silicon oxide layer 3b as a mask to form an isolation groove 2 of approximately 60 μm depth on one surface of the substrate 1. Here, a region surrounded by the groove 2 is the portion to be the element region by dielectric isolation in island form.

Next, as shown in FIG. 1B, after removing the silicon oxide layer 3B, the surface of the substrate 1 where the groove 2 is formed, is oxidized to form a silicon oxide layer 3C of approximately 2 μm as a dielectric layer. Subsequently, a first polycrystalline silicon layer 4A is grown on the surface of the silicon oxide dielectric layer 3C by the chemical vapor deposition (CVD) method to bury the groove 2. The first polycrystalline silicon layer 4a is further deposited up to the thickness of approximately 100 μm on the substrate.

Deposition of the polycrystalline silicon layer 4A by the CVD method may cause unevenness on the surface since the growth direction of the polycrystal is differentiated at the portion of the groove 2. In order to eliminate this, the surface of the polycrystalline silicon layer 4A is mechanically ground for flattening. Subsequently, by providing mechanochemical grinding, the surface of the polycrystalline silicon layer 4A is further flattened.

Next, as shown in FIG. 1C, on the flattened surface of the first polycrystalline silicon layer 4A, a second polycrystalline silicon layer 4B having a smaller crystal size than that of the first polycrystalline silicon layer 4A, is deposited in a thickness of approximately 5 μm to form a buffer layer. Then, mechanochemical grinding is performed until the unevenness on the surface of the buffer layer 4B becomes less than or equal to 10 nm to a form smooth junction surface.

Subsequently, as shown in FIG. 1D, a support substrate 6 of a single-crystalline silicon is prepared. With one surface as a major surface, the support substrate 6 is laminated on the substrate 1 and mated with the major surface of the smoothed buffer layer 4B.

Finally, as shown in FIG. 1E, the surface of the polycrystalline silicon substrate 1 at the side opposite to the side where the groove 2 is formed, is ground until the bottom of the groove is exposed to form the island form element region isolated by the groove 2. Thereafter, the support substrate 6 is ground up to a predetermined substrate thickness. Thus, the dielectric isolation substrate having a laminated structure, in which the single-crystalline silicon substrate 1 is laminated on the single-crystalline silicon support substrate 6, is completed.

As can be appreciated, in the first prior art illustrated in FIGS. 1A to 1E set forth above, the smoothness of the polycrystalline silicon layer 4A formed on the single-crystalline silicon layer 1 is improved by providing a higher density polycrystalline silicon layer 4B as the buffer layer and whereby tightness of the junction between the single-crystalline silicon layer 1 and the single-crystalline silicon support layer 6. However, the inventors have found through supplementary experiments that it is not possible to completely avoid formation of the voids during annealing after fitting the ground surface of the buffer layer (polycrystalline silicon layer 4B) and the support substrate 6. It is considered that the cause of this is that the smoothness of the buffer layer (polycrystalline silicon layer 4B) is still insufficient and complete junction between the buffer layer and the support substrate 6 is difficult since the junction surface of the support substrate is occupied by the single-crystalline silicon.

On the other hand, as the second prior art, a fabrication process of the dielectric isolation substrate to provide the combination of the polycrystalline silicon and silicon oxide at the junction interface for laminating the single-crystalline silicon substrate 1 and the support substrate 6, has been disclosed in Japanese Unexamined Patent Publication No. Heisei 3-252154. The disclosed construction is to form the polycrystalline silicon layer 4 on the dielectric layer (silicon oxide layer) 3 formed on one surface of the single-crystalline silicon layer 1. Subsequently, the polycrystalline silicon layer 4 is ground and polished to form the major surface. With fitting the major surface of the single-crystalline silicon substrate 1 with the major surface of an oxide layer 13 formed on the support substrate 6 of single-crystalline silicon to form the dielectric isolation substrate.

However, even in the second prior art, it is found that when the polished polycrystalline silicon layer 4 and the oxide layer 13 formed on the support substrate 6 of single-crystalline silicon are fitted to form the junction, voids are frequently caused. From this fact, it is understood that a satisfactory junction cannot be obtained merely by forming the oxide layer on the support substrate and fitting the substrates and mating the oxide layer with the polycrystalline silicon layer.

SUMMARY OF THE INVENTION

Therefore, it is an object of the present invention to provide a fabrication process of a dielectric isolation substrate which will not cause a void at the junction interface.

According to an aspect of the invention, a fabrication process for a dielectric isolation substrate comprises a step of forming an isolation groove on one side of a single-crystalline silicon substrate, a step of forming a dielectric layer on the surface including the groove, a step of depositing a polycrystalline silicon layer on the dielectric layer until at least the groove is buried, a step of forming a buffer layer on the surface after polishing of the polycrystalline silicon layer for forming a smoothed surface, a step of forming a first junction interface by polishing the buffer layer, a step of forming an oxide layer on one surface of a supporting substrate to form a second junction interface on the surface of said oxide layer, a step of fitting the first junction interface on the buffer layer and the second junction interface of the oxide layer on one surface of the supporting substrate, a step of annealing the first and second junction interface after fitting, and a step of polishing the other major surface of the single-crystalline silicon substrate other than the major surface formed with the groove to expose the dielectric layer at the bottom of the groove to define a plurality of single-crystalline silicon islands isolated by the dielectric layer.

The inventor has found that the junction between the polycrystalline silicon layer and the silicon oxide layer has a better junction interface and bonding strength than the junction between the polycrystalline silicon layer and the single-crystalline silicon layer. Therefore, according to the present invention, the junction interface of the supporting substrate is replaced from the conventional single-crystalline silicon layer with a silicon oxide layer. This can be realized by forming the silicon oxide layer on the major surface of the supporting substrate. Therefore, the junction interface becomes the combination of the buffer layer (polycrystalline silicon layer or so forth) and the silicon oxide layer formed on the supporting substrate.

The oxide layer formed on the supporting substrate is subject to annealing after fitting with the buffer layer. By placing the oxide layer in the high temperature atmosphere at about 1100° C. the oxide layer is softened to have flowing ability. As a result, the fine unevenness residing on the junction surface of the buffer surface mating with the oxide layer can be completed buried by flow and deformation of the oxide layer. By this, the dielectric isolation substrate having a junction without voids can be obtained. By employing PSG layer or BPSG layer and so forth as the oxide layer, necessary annealing temperature can be lowered.

Therefore, the present invention can realize the dielectric isolation substrate completely avoiding occurrence of voids by providing the buffer layer on the polycrystalline silicon layer covering the isolation groove formed in the single-crystalline silicon substrate, and by annealing after fitting the surface of the buffer layer to the surface of the oxide layer formed on the supporting substrate. By employing such substrate, a quite reliable semiconductor device can be obtained.

BRIEF DESCRIPTION OF THE DRAWINGS

The present invention will be understood more fully from the detailed description given hereinafter with reference to the accompanying drawings of the preferred embodiment of the invention, which, however, should not be taken to be limitative to the invention, but are for explanation and understanding only.

In the drawings:

FIGS. 1A to 1E are sections of a substrate showing the conventional dielectric isolation substrate fabrication process;

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to not unnecessarily obscure the present invention.

According to the present invention, a dielectric isolation substrate is fabricated. The dielectric isolation substrate comprises a supporting substrate, an oxide layer formed on the major surface of the supporting substrate, a buffer layer fitted with the oxide layer, a polycrystalline silicon layer laminated over the buffer layer, and a plurality of single-crystalline silicon islands formed over the polycrystalline silicon layer via the dielectric layer and mutually isolated by dielectric layer.

FIGS. 3A to 3E show sections of a substrate showing progress of a dielectric isolation substrate fabrication process according to the first embodiment of the present invention.

Figure 3A:
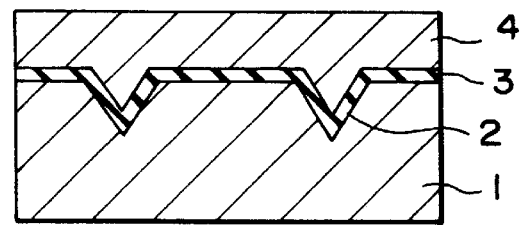
FIGS. 3A to 3E are section of the substrate showing a dielectric isolation substrate fabrication process according to the first embodiment of the present invention.

At first, as shown in FIG. 3A, on a major surface at one side of a single-crystalline silicon substrate 1 having 4 inches of diameter and approximately 500 μm of thickness, an isolation groove 2 having approximately 70 μm of depth is formed. Thereafter, over the entire surface including the groove 2, a silicon oxide layer 3 is formed. Then, over the silicon oxide layer 3, a polycrystalline silicon layer 4 is formed in a thickness of approximately 100 μm by way of a chemical vapor deposition (CVD) method. The polycrystalline silicon layer 4 to be formed at this stage is required to completely bury the isolation groove 2.

Figure 3B:
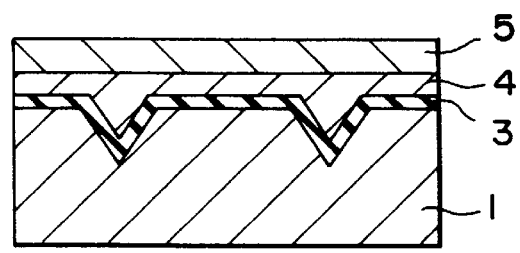

As shown in FIG. 3B, the surface of the polycrystalline silicon layer 4 is mechanically ground. Thereafter, mechanochemical polishing is further performed for smoothing the surface. The thickness of the polycrystalline silicon layer 5 to be formed as an element region through the later stage is desired to be within a range of 30 to 50 μm.

On the smoothed surface of the polycrystalline silicon 4, a buffer layer 5, such as an amorphous silicon layer, is deposited in a thickness of 2 to 3 μm by way of chemical vapor deposition. Then, mechanochemical polishing is performed for the surface of the buffer layer 5 until the residual fine unevenness on the surface is reduced to be less than or equal to 10 nm. Thus, the smoothed surface of the buffer layer 5 serves as a junction surface. It should be noted that, while the shown first embodiment employs amorphous silicon in forming the buffer layer 5, the material to form the buffer layer may be a polycrystalline silicon layer having smaller polycrystal size or a silicon oxide layer may be employed in its place.

Figure 3C:
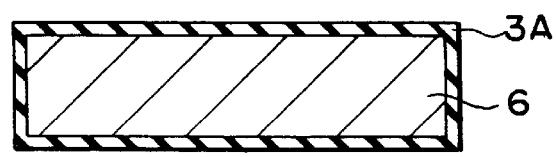

Then, as shown in FIG. 3C, as a supporting substrate 6, a single-crystalline silicon substrate 6 is formed in 4 inches of diameter and approximately 500 μm of thickness. Then, for the entire surface of the supporting substrate 6, the oxide layer 3A having a thickness of 1 μm is formed by way of annealing.

Subsequently, the oxide layer 3A is removed at the portion where the oxide layer is not necessary to maintain the oxide layer only at one side major surface of the supporting substrate 6. The residual oxide layer 3A is taken as the junction surface.

Figure 3D:
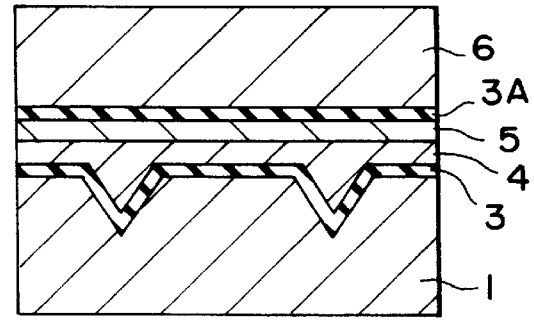

Thereafter, as shown in FIG. 3D, the substrates are laminated by mating the oxide layer 3a of the supporting substrate 6 and the buffer layer 5 to each other. Subsequently, the laminated substrates are subject to an annealing at a temperature of 1100° C. or higher. Through this process, the oxide layer 3A of the junction interface is softened. Then, the fine unevenness residing on the junction surface of the buffer layer 5 can be completely covered by fluidizing of the oxide layer 2. Therefore, by this annealing, the junction strength is increased to realize a complete junction where no voids are formed.

Figure 3E:
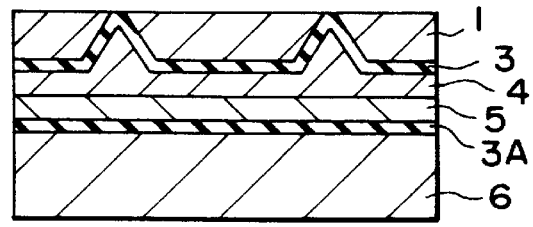

Finally, as shown in FIG. 3E, similarly to the conventional process, at the opposite side surface to the groove is ground until the silicon oxide layer at the bottom of the groove 2 is exposed to complete formation of the dielectric isolation substrate in the laminated structure thereby defining the element region by the silicon oxide layer 3. In the shown embodiment, since the bonding ability of the supporting substrate 1 does not depend on the thermal oxidization condition and thermal oxide layer formation method, it becomes possible that the thermal oxidization condition and the thermal oxide layer forming method may be arbitrarily employed.

It should be noted that the thickness of the oxide layer 3A is less than approximately 0.1 μm, fluidization during annealing becomes insufficient to possibly cause difficulty in completely eliminating void in the junction interface. Also, when the thickness of the oxide layer is greater than approximately 3 μm, the magnitude of bending of the dielectric isolation substrate becomes substantial. Therefore, the thickness of the oxide layer 3A is in a range of 0.1 to 3 μm, and more preferably in a range of approximately 0.5 to 1 μm.

Figure 2:
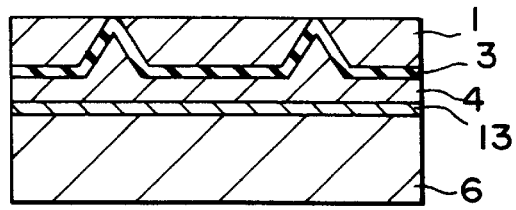
FIG. 2 is a section of a substrate for explaining another conventional dielectric isolation substrate.
Figure 4:
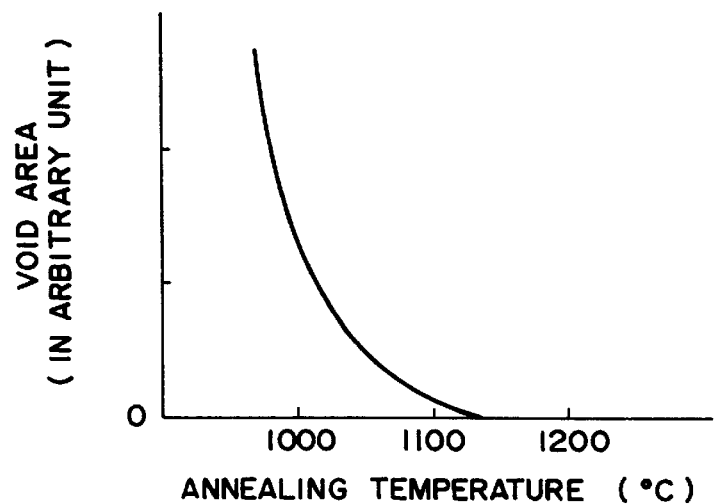
FIG. 4 is an illustration showing a relationship between an annealing temperature after lamination of the substrates and void area.

FIG. 4 shows a relationship between the annealing temperature and void area (in arbitrary unit) in the experiments where the annealing is performed at different temperatures after lamination of the supporting substrate. It should be noted that amorphous silicon was employed for the buffer layer. The annealing was performed for two hours. For measurement of the void area, an X-ray topography was employed. From FIG. 4, it should be appreciated that the void is abruptly decreased according to elevating the annealing temperature and becomes substantially non-existent at the annealing temperature higher than or equal to 1100° C. Therefore, it should be appreciated that the annealing after lamination has to be performed at high temperature, higher than or equal to 1100° C. in order to completely eliminate occurrence of voids.

Figure 5:
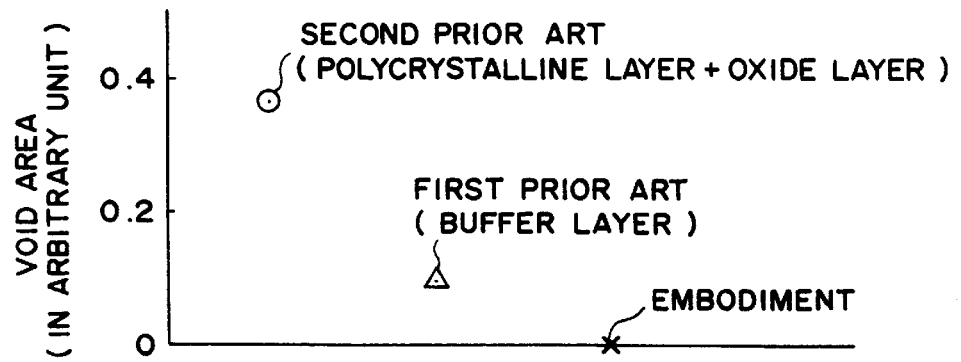
FIG. 5 is an illustration showing void areas in the shown embodiment and the prior art.

FIG. 5 shows a comparison of the void areas in the dielectric isolation substrate fabricated by the first embodiment as set forth above, and that fabricated by the foregoing first and second prior art method. It should be noted, that as a common condition, the polycrystalline silicon layer thickness was 20 μm, the annealing temperature was 1100° C. and the annealing period was 2 hours. As is clear from FIG. 5, by the shown embodiment, occurrence of void can be completely eliminated.

Next, the second embodiment of the present invention will be discussed. In the second embodiment, the oxide layer 3A on the surface of the support substrate 6 as discussed with respect to FIG. 3C is formed in a thickness of approximately 1 μm by CVD method instead of thermal oxidization in the first embodiment. Then, the buffer layer 5 on the single-crystalline silicon substrate 1 as discussed with respect to FIGS. 3A and 3B is mated with the oxide layer formed by the CVD method. After lamination, the same processes to the foregoing first embodiment are performed to complete the dielectric isolation substrate.

In this second embodiment, since the oxide layer is deposited on one surface of the supporting substrate 6, the supporting substrate is not limited to the single-crystalline silicon substrate. For instance, quartz glass having a smooth major surface, or a semiconductor substrate other than silicon may also be used. Also, since the oxide layer is deposited on the one side surface of the substrate 6, the process step can be reduced in comparison with the first embodiment which is required to remove the oxide layer other than the element region.

Next, discussion will be given with respect to the third embodiment of the invention. In the third embodiment, the oxide layer 3A is formed of PSG film or BPSG film containing several molecular % of phosphorous and/or boron with respect to FIG. 3C. Since the softening temperature of the PSG film and the BSG film is low in a range of 700 to 800° C. they permit lowering of annealing temperature. Therefore, the slippage of the single-crystalline silicon can be restricted to improve characteristics and durability of the semiconductor device formed in the silicon island.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A fabrication process for a dielectric isolation substrate comprising steps of:

forming an isolation groove on one side of a single-crystalline silicon substrate;

forming a dielectric layer on said one side and within said groove;

depositing a polycrystalline silicon layer on said dielectric layer until at least said groove is buried;

polishing said polycrystalline silicon layer to form a smoothed surface;

forming a buffer layer on the smoothed surface after said polishing of said polycrystalline silicon layer step;

forming a first junction interface by polishing said buffer layer;

forming an oxide layer on one surface of a supporting substrate, thereby forming a second junction interface on a surface of said oxide layer;

fitting said first junction interface on said second junction interface;

annealing said first and second junction interfaces after said fitting step; and polishing a surface of said single-crystalline silicon substrate to expose the dielectric layer at the bottom of said groove, thereby defining a plurality of single-crystalline silicon islands isolated by said dielectric layer.

2. A fabrication process for a dielectric isolation substrate as set forth in claim 1, wherein said annealing is performed for burying fine unevenness residing in said buffer layer by softening and fluidizing said oxide layer.

3. A fabrication process for a dielectric isolation substrate as set forth in claim 1, wherein said buffer layer is selected from the group consisting of a polycrystalline silicon layer, an amorphous silicon layer and a silicon oxide layer.

4. A fabrication process for a dielectric isolation substrate as set forth in claim 1, wherein said oxide layer is selected from the group consisting of an oxide layer formed by thermal oxidization, an oxide layer formed by a CVD method and an oxide layer doped with impurity.

5. A fabrication process for a dielectric isolation substrate as set forth in claim 4, wherein said impurity is one of phosphorous and boron.

6. A fabrication process for a dielectric isolation substrate as set forth in claim 1, wherein the thickness of the polycrystalline silicon layer formed on said dielectric layer is 30 to 50 $\mu$m.

7. A fabrication process for a dielectric isolation substrate as set forth in claim 1, wherein said buffer layer is formed by depositing a non-crystalline silicon by CVD method in a thickness of 2 to 3 $\mu$m.

8. A fabrication process for a dielectric isolation substrate as set forth in claim 1, wherein said buffer layer has unevenness on the surface less than or equal to 10 nm after the polishing.

9. A fabrication process for a dielectric isolation substrate as set forth in claim 1, wherein said oxide layer on said supporting substrate has a thickness of 0.1 to 3 $\mu$m.

10. A fabrication process for a dielectric isolation substrate as set forth in claim 1, wherein said annealing is performed at a heating temperature higher than or equal to 1100° C.

11. A fabrication process according to claim 9, wherein said oxide layer has a thickness of 0.5 to 1.0 $\mu$m.

* * * * *